(12) United States Patent
Iisaka et al.

(10) Patent No.: US 10,334,768 B2
(45) Date of Patent: *Jun. 25, 2019

(54) COMPONENT MOUNTING DEVICE

(71) Applicant: FUJI CORPORATION, Chiryu (JP)

(72) Inventors: Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 299 days.

This patent is subject to a terminal disclaimer.

(21) Appl. No.: 15/128,694

(22) PCT Filed: Mar. 25, 2014

(86) PCT No.: PCT/JP2014/058215
§ 371 (c)(1),
(2) Date: Sep. 23, 2016

(87) PCT Pub. No.: WO2015/145565
PCT Pub. Date: Oct. 1, 2015

(65) Prior Publication Data
US 2017/0142875 A1 May 18, 2017

(51) Int. Cl.
H05K 13/02 (2006.01)
H05K 13/04 (2006.01)
H05K 13/08 (2006.01)

(52) U.S. Cl.
CPC ......... *H05K 13/0413* (2013.01); *H05K 13/02* (2013.01); *H05K 13/0408* (2013.01); *H05K 13/08* (2013.01); *H05K 13/085* (2018.08); *H05K 13/0812* (2018.08); *H05K 13/0813* (2018.08); *H05K 13/0853* (2018.08)

(58) Field of Classification Search
CPC ........... H05K 13/0413; H05K 13/0812; H05K 13/085; H05K 13/0813; H05K 13/0853; H05K 13/02; H05K 13/0408; H05K 13/08
See application file for complete search history.

(56) References Cited

U.S. PATENT DOCUMENTS

| | | | |
|---|---|---|---|
| 9,642,295 B2* | 5/2017 | Teshima | H05K 13/0469 |
| 9,804,592 B2* | 10/2017 | Fukao | H05K 13/08 |
| 10,039,218 B2* | 7/2018 | Kubota | H05K 13/028 |
| 2002/0083579 A1 | 7/2002 | Suhara et al. | |
| 2017/0112031 A1* | 4/2017 | Iisaka | H05K 13/08 |
| 2017/0142875 A1* | 5/2017 | Iisaka | H05K 13/0413 |

(Continued)

FOREIGN PATENT DOCUMENTS

| | | |
|---|---|---|
| EP | 1 220 595 A2 | 7/2002 |
| EP | 1 935 223 A1 | 6/2008 |
| JP | 2001-57497 A | 2/2001 |

(Continued)

OTHER PUBLICATIONS

International Search Report dated Jul. 1, 2014 in PCT/JP2014/058215 filed Mar. 25, 2014.

(Continued)

*Primary Examiner* — Minh H Trinh
(74) *Attorney, Agent, or Firm* — Oblon, McClelland, Maier & Neustadt, L.L.P.

(57) ABSTRACT

A component mounting device with which an improvement in production efficiency may be achieved by adjusting the timing of the Q-axis rotation is provided.

5 Claims, 11 Drawing Sheets

(56) References Cited

U.S. PATENT DOCUMENTS

2017/0325371 A1* 11/2017 Oyama ............... H05K 13/046
2018/0054930 A1* 2/2018 Nishiyama ......... H05K 13/0408

FOREIGN PATENT DOCUMENTS

| JP | 2003-209395 A | 7/2003 |
| JP | 2005-150387 A | 6/2005 |
| JP | 2007-142211 A | 6/2007 |

OTHER PUBLICATIONS

Extended European Search Report dated Feb. 16, 2017 in patent application No. 14887134.6.
Office Action dated Jan. 30, 2018 in Japanese Patent Application No. 2016-509662 (with English language translation), 6 pages.

* cited by examiner

FIG. 6

|  | MOUNTING POSITION P4 | MOUNTING POSITION P5 | MOUNTING POSITION P6 |
|---|---|---|---|
| MOUNTING TIME T4 OF CASE IN WHICH Q-AXIS ROTATION IS STARTED BEFORE IMAGING | 152ms | 202ms | 252ms |
| MOUNTING TIME T4 OF CASE IN WHICH Q-AXIS ROTATION IS STARTED AFTER IMAGING | 182ms | 182ms | 230ms |
| FIRST MOVEMENT TIME T1 − SECOND MOVEMENT TIME T2 | 80−50= 30ms | 80−100= −20ms | 80−150= −70ms |

FIG. 10

|  | MOUNTING POSITION P4 | MOUNTING POSITION P5 | MOUNTING POSITION P6 |
|---|---|---|---|
| MOUNTING TIME T4 OF CASE IN WHICH Q-AXIS ROTATION IS STARTED BEFORE IMAGING | 184ms | 234ms | 284ms |
| MOUNTING TIME T4 OF CASE IN WHICH Q-AXIS ROTATION IS STARTED AFTER IMAGING | 214ms | 214ms | 230ms |
| MOUNTING TIME T4 OF CASE IN WHICH Q-AXIS ROTATION IS DIVIDED INTO BEFORE AND AFTER IMAGING | 204ms | 204ms | 252ms |
| ROTATION TIME T8 − FIRST REQUIRED TIME EQUATION (1) | 134−80=54ms | | |
| ROTATION TIME T8 − SECOND REQUIRED TIME EQUATION (2) | 134−50= 84ms | 134−100= 34ms | 134−150= −16ms |
| ROTATION TIME T3 − FIRST REQUIRED TIME EQUATION (3) | 102−80=22ms | | |
| ROTATION TIME T3 − SECOND REQUIRED TIME EQUATION (4) | 102−50= 72ms | 102−100= 2ms | 102−150= −48ms |
| EQUATION (5) = EQUATION (3) + EQUATION (4) | 22+72= 94ms | 22+2= 24ms | 22−48= −26ms |

COMPONENT MOUNTING DEVICE

TECHNICAL FIELD

The present application relates to a component mounting device which carries out Q-axis rotation in which an angle of a supplied component is matched to an angle at which the component is to be mounted onto a target object such as a circuit board.

BACKGROUND ART

In the related art, a component mounting machine which mounts electronic components onto a circuit board is an example of a component mounting device which mounts components onto a target object. For example, there is a component mounting machine in which a plurality of mounting nozzles are attached to a nozzle holder provided on a mounting head, and electronic components are sucked and held by each of the mounting nozzles. For example, a component mounting machine disclosed in PTL 1 is provided with an R-axis drive system which rotates a nozzle holder, and a Q-axis drive system which individually rotates a plurality of mounting nozzles. In the component mounting machine, the mounting nozzles which are attached in ring formation to surround a rotating shaft which passes through the center of the nozzle holder revolve with the rotation of the nozzle holder. Work content to be carried out is set at the positions (stations) at which the revolving mounting nozzles stop.

The mounting nozzle sucks an electronic component which is supplied from a feeder at a suction station. Next, the mounting nozzle performs Q-axis rotation to perform broad angle adjustment of the electronic component at a Q-axis large rotary station, which is the next station from the suction station. This is in order to match the rotational angle of the sucked electronic component to the angle at which the electronic component is to be mounted onto the circuit board. The state of the mounting nozzle holding the electronic component is imaged by a camera device at the next planar image capture station. The component mounting machine detects and corrects positional shifting and the like of the electronic component in relation to the center of the mounting nozzle based on the image data which is captured by the camera device.

Incidentally, the imaging process of the electronic component is generally carried out in a state in which the Q-axis rotation is stopped. In detail, in this type of component mounting machine, in recent years, in order to increase the mounting efficiency of the electronic component, a control method is used in which the electronic component is imaged while still moving without stopping the mounting head and the mounting nozzle above the camera device. In this control method, when the mounting nozzle is imaged while moving, there is a concern that blurring or the like of the image will occur, and positional shifting of the electronic component in relation to the mounting nozzle may not be precisely detected. To handle this concern, there is a component mounting machine in which marks which serve as a reference of the nozzle holder or the like are provided, the marks are imaged together with the electronic component, and thus, the shifting of the electronic component is detected using the marks as a reference and the detection precision is improved. Therefore, when the Q-axis rotation is carried out during the imaging, since it becomes necessary to detect the position of the marks also taking positional shifting during rotation into consideration and the processing content becomes complex, the imaging process of the electronic component is carried out in a state in which the electronic component is stopped at a predetermined imaging angle which is set in advance.

Alternatively, in the camera device, an imaging region corresponding to the imaging performance is set; however, a reduction in manufacturing costs may be anticipated by catering the imaging region to the largest electronic component among those to be handled and suppressing an expansion of unnecessary imaging performance. Meanwhile, when a large electronic component is subjected to Q-axis rotation during the imaging, there is a concern that a portion of the electronic component will fall outside of the imaging region which is limited to a minimum necessary size. From the points described above, it is preferable that the Q-axis rotation is stopped during the imaging.

CITATION LIST

Patent Literature

PTL 1: JP-A-2003-209395

SUMMARY

In the component mounting machine described above, processing content to be carried out at each station such as Q-axis rotation or an imaging process is set corresponding to the positions of the stations in advance. Therefore, the timing at which to perform the Q-axis rotation is started at the same timing, even if the angle of the Q-axis rotation is different. In this case, in the component mounting machine, if the distance from the supply position of the electronic component of the feeder to the imaging position of the camera device is secured by a sufficient distance for carrying out the Q-axis rotation, the Q-axis rotation is completed during the movement to the imaging position.

Meanwhile, in the component mounting machine, it becomes possible to shorten the movement distance of the mounting nozzle and achieve a shortening of the mounting time by shortening the distance between the supply position and the imaging position. Alternatively, in the component mounting machine, it becomes possible to achieve a reduction in size of the device by disposing the feeder and the camera device in proximal positions. However, in the component mounting machine, the shorter the distance from the supply position to the imaging position, the more difficult it becomes to complete the rotation during the movement to the imaging position when the angle of the Q-axis rotation is great. Therefore, in the component mounting machine in which the timing of the Q-axis rotation described above is fixed, in a case in which the angle of the Q-axis rotation is great, there is a concern that the imaging process may not be carried out before the Q-axis rotation is completed, bringing about an increase in the mounting time, moreover, a reduction in production efficiency.

The present disclosure is made in consideration of the problems described above, and an object is to provide a component mounting device with which an improvement in production efficiency may be achieved by adjusting the timing of the Q-axis rotation.

In order to solve the problems described above, a component mounting device according to one embodiment of the present application includes a component supply device which supplies a component to be mounted onto a target object to a supply position, a movable section which includes a mounting nozzle which acquires and holds the component from the supply position, and which mounts the component which is held by the mounting nozzle onto a mounting position of the target object, a driving mechanism which moves the movable section and causes the mounting nozzle to rotate around a Q-axis which is a rotating shaft, an imaging device which images the component which is held by the mounting nozzle at an imaging position, and a control section which controls the driving mechanism to move the movable section from the supply position to the mounting position via the imaging position, in which when the movable section moves from the supply position to the mounting position, the control section compares a first required time which is required for movement from the supply position to the imaging position with a second required time which is required for movement from the imaging position to the mounting position, and starts Q-axis rotation of the mounting nozzle in a movement operation of whichever of the two required times is the longer required time.

In the component mounting device according to another embodiment, in a case in which a time from start to completion of the Q-axis rotation by the mounting nozzle is a rotation time, and in a case in which the rotation time is less than or equal to the first required time, the control section starts the Q-axis rotation of the mounting nozzle in the movement operation from the supply position to the imaging position.

In the component mounting device according to another embodiment, the imaging device is set to image the component in a state of being held at one imaging angle among a plurality of imaging angles which are set for every angle equally spaced in relation to a rotational angle around the Q-axis, and the control section is capable of carrying out the Q-axis rotation divided into two, from the supply position to the imaging position, and from the imaging position to the mounting position, is set to start an operation in which the mounting nozzle is subjected to the Q-axis rotation to a predetermined imaging angle and subsequently complete the rotation after a first divided time has elapsed in movement from the supply position to the imaging position, and to start an operation in which the mounting nozzle is subjected to the Q-axis rotation by a remaining rotational angle and subsequently complete rotation after a second divided time has elapsed in movement from the imaging position to the mounting position, and carries out the Q-axis rotation in conditions under which a required time is shortest among the following three required times (first divided time–first required time+second divided time –second required time), (rotation time–first required time), and (rotation time–second required time).

In the component mounting device according to another embodiment, the movable section is provided with a plurality of mounting nozzles, and the control section includes a time which is required for other mounting nozzles excluding a first mounting nozzle to acquire the components from the supply position after, among the plurality of mounting nozzles, the first mounting nozzle acquires the component in the first required time of the first mounting nozzle.

In the component mounting device according to another embodiment, the movable section is provided with a plurality of mounting nozzles, and the control section includes a time which is required for other mounting nozzles excluding a first mounting nozzle to mount the components onto the mounting positions before, among the plurality of mounting nozzles, the first mounting nozzle mounts the component onto the mounting position of the target object in the second required time of the first mounting nozzle.

Effects

In the component mounting device of one embodiment, when the movable section moves from the supply position of the component supply device to the mounting position of the target object via the imaging position of the imaging device, the control section compares the time (the first required time) which is required for the movement from the supply position to the imaging position with the time (the second required time) which is required for the movement from the imaging position to the mounting position. The control section starts the Q-axis rotation of the mounting nozzle in the movement operation with the longer required time of the two required times. According to the component mounting device, since the carrying out of the Q-axis rotation is started during the operating in which the movement time is longer among the movement operations before and after the imaging process, it becomes possible to reduce the waiting time in which the next process (a suction position correction process for the imaging process or the mounting, or the like) enters a standby state until the Q-axis rotation is completed. As a result, the component mounting device is capable of achieving a shortening in the mounting time and achieving an improvement in production efficiency. According to the component mounting device, adjustment which shortens the first required time becomes possible by optimizing the start timing of the Q-axis rotation. Therefore, it becomes possible for the component mounting device to shorten the first required time, that is, to shorten the inter-device physical distance between the component supply device and the imaging device and be disposed in close proximity thereto, and a reduction in device size may be achieved.

In the component mounting device according to another embodiment, in a case in which the rotation time in which the mounting nozzle is subjected to the Q-axis rotation is less than or equal to the first required time, the control section starts the Q-axis rotation in the movement operation from the supply position to the imaging position. In this type of component mounting device, it becomes possible to detect and correct the error which arises through the operations (the Q-axis rotation and the like) carried out by the imaging device before the imaging based on the imaging data of the imaging device. Therefore, in a case in which the mounting time is not taken into consideration, it is preferable that the component mounting device completes the Q-axis rotation before the imaging. Therefore, in a case in which the rotation time is less than or equal to the first required time, even in a case in which the second required time is long in comparison to the first required time, the control section prioritizes carrying out the Q-axis rotation before the imaging. Accordingly, the control section becomes capable of achieving both a shortening in the mounting time through optimization of the start timing of the Q-axis rotation, and an improvement in the processing precision of mounting the component onto the target object through prioritizing carrying out the Q-axis rotation before the imaging.

In the component mounting device according to another embodiment, the imaging device images the component in a state of being held at one of the imaging angles among the plurality of imaging angles which are set for every angle equally spaced in relation to the rotational angle around the Q-axis. The control section is configured to be capable of carrying out the Q-axis rotation divided into two times, from the supply position to the imaging position, and from the imaging position to the mounting position. In the movement from the supply position to the imaging position, the control section subjects the mounting nozzle to the Q-axis rotation in the first divided time to a predetermined imaging angle. In the movement from the imaging position to the mounting position, the control section subjects the mounting nozzle to the Q-axis rotation in the second divided time by the remaining rotational angle. The control section carries out the Q-axis rotation in conditions under which the required time is shortest among the three required times (first divided time–first required time+second divided time–second required time), (rotation time–first required time), and (rotation time–second required time). According to the component mounting device, the Q-axis rotation may be carried out divided into before and after the imaging, and the start timing of the Q-axis rotation is optimized to enable more reliable shortening of the mounting time.

In the component mounting device according to another embodiment, the control section includes a time which is required for the other mounting nozzles excluding the first mounting nozzle to acquire the components from the supply position after, among the plurality of mounting nozzles, the first mounting nozzle acquires the component in the first required time of the first mounting nozzle. The time in which the other mounting nozzles acquire the components after the first mounting nozzle acquires the component is a time in which it is possible for the first mounting nozzle to perform the Q-axis rotation. Therefore, in a case in which the movable section is provided with the plurality of mounting nozzles, the control section is capable of determining a more appropriate start timing of the Q-axis rotation by including the time in which the mounting nozzles are carrying out the respective suction work in the first required time for the Q-axis rotation.

In the component mounting device according to another embodiment, the control section includes a time which is required for the other mounting nozzles excluding the first mounting nozzle to mount the components onto the mounting positions before, among the plurality of mounting nozzles, the first mounting nozzle mounts the component onto the mounting position of the target object in the second required time of the first mounting nozzle. The time in which the other mounting nozzles mount the components before the first mounting nozzle mounts the component is a time in which it is possible for the first mounting nozzle to perform the Q-axis rotation. Therefore, in a case in which the movable section is provided with the plurality of mounting nozzles, the control section is capable of determining a more appropriate start timing of the Q-axis rotation by including the time in which the mounting nozzles are carrying out the respective mounting work in the second required time for the Q-axis rotation.

BRIEF DESCRIPTION OF DRAWINGS

FIG. 6 is a table for comparing mounting times at each mounting position.

FIG. 10 is a table for comparing mounting times at each mounting position.

DESCRIPTION OF EMBODIMENTS

Figure 1:
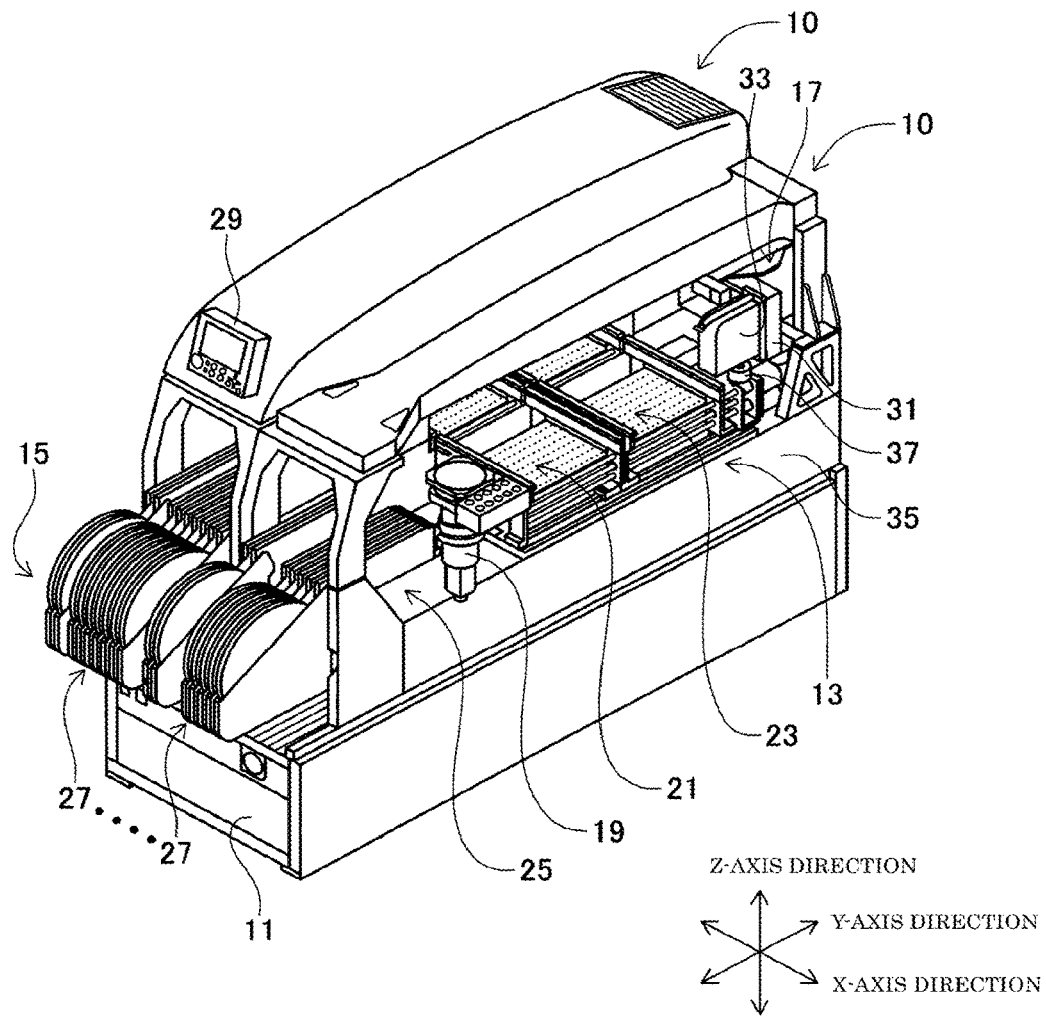
FIG. 1 is a perspective diagram illustrating the device configuration of a component mounting machine of the present example.

Hereinafter, an example that embodies the present disclosure will be described with reference to the drawings. FIG. 1 is a perspective diagram illustrating a component mounting machine 10 of the present example. FIG. 1 illustrates two of the component mounting machines 10 provided to line up on a shared base 11. The component mounting machine 10 is linked, for example, with other devices such as a solder printing machine, a board inspection machine, and a reflow machine to form a production line, and is a device which produces circuit boards onto which multiple electronic components are mounted. Since the two component mounting machines 10 have the same configuration, description will be given centered on one of them. In the component mounting machine 10, various devices such as a board conveyance device 13, a component supply device 15, a head driving mechanism 17, and a camera device 19 are attached onto the shared base 11. In the following description, as illustrated in FIG. 1, description will be given referring to a direction in which the component mounting machines 10 are provided to line up as an X-axis direction, referring to a direction perpendicular to the X-axis direction parallel to a board plane of the circuit board which is conveyed as a Y-axis direction, and referring to a direction which is perpendicular to both the X-axis direction and the Y-axis direction as a Z-axis direction.

The board conveyance device 13 is a so-called double conveyor type device in which a first conveyance device 21 and a second conveyance device 23 are provided to line up in the Y-axis direction. Each of the first and second conveyance devices 21 and 23 includes a pair of conveyor belts (not illustrated) which are arranged along the X-axis direction. Each of the first and second conveyance devices 21 and 23 causes the pair of conveyor belts to revolve, and conveys the circuit board which is supported on the conveyor belts in the X-axis direction. Each of the first and second conveyance device 21 and 23 pinches and fixes the circuit board which is conveyed to the stopping position at which the mounting work of the components is performed in the Z-axis direction using a stopper (not illustrated) which is provided above the circuit board, and a clamper (not illustrated) which is provided beneath. For example, Each of the first and second conveyance devices 21 and 23 conveys the circuit board which is carried in from an upstream device such as a solder printing machine in the X-axis direction, and clamps the circuit board in the stopping position. When the mounting work is completed, the first and second conveyance devices 21 and 23 convey the circuit board in the X-axis direction to carry the circuit board out to the device of the following stage.

The component supply device 15 is a feeder system device and is provided on the front end portion (the bottom-left side of FIG. 1) of the component mounting machine 10 in the Y-axis direction. In the component supply device 15, a plurality of feeders 25 are provided on the shared base 11 to line up in the X-axis direction. Each of the feeders 25 is configured to be capable of attaching to and detaching from the shared base 11, and supplies an electronic component from a tape feeder 27 to a supply position. A carrier tape which is a medium which supplies electronic components and holds multiple electronic components at a fixed interval is wound around the tape feeder 27. In the feeder 25, the tip of the carrier tape is pulled out to the supply position, and the feeder 25 supplies a different type of electronic component for every carrier tape. The supply positions of the feeders 25 are provided to line up along the X-axis direction. Therefore, in the supply positions, if the type of electronic component is different, the position in the X-axis direction is different.

The head driving mechanism 17 is an XY robot-type moving device. The head driving mechanism 17 is provided with an X-axis driving mechanism 41 (refer to FIG. 2) which causes a slider 31 to slide in the X-axis direction through the driving of an electromagnetic motor, and a Y-axis driving mechanism 43 (refer to FIG. 2) which causes the slider 31 to slide in the Y-axis direction. A mounting head 33 is attached to the slider 31. The mounting head 33 moves to an arbitrary position over a frame section 35 of the component mounting machines 10 which are installed on the shared base 11 due to the two driving mechanisms 41 and 43 being driven. In the X-axis driving mechanism 41 and the Y-axis driving mechanism 43, it is possible to use a linear motor mechanism, a ball screw feed mechanism, or the like, for example as the driving source.

A nozzle holder 37 is provided below the mounting head 33. The nozzle holder 37 holds a plurality of mounting nozzles facing downward. Each of the mounting nozzles is connected to negative pressure air and positive pressure air paths via a positive and negative pressure supply device (not illustrated), sucks and holds an electronic component with the negative pressure, and releases the held electronic component through the supply of a little positive pressure. The mounting head 33 includes an R-axis rotation driving mechanism 45 (refer to FIG. 2) which rotationally drives the nozzle holder 37 around the Z-axis. The mounting head 33 includes a Z-axis driving mechanism 47 (refer to FIG. 2) which individually causes the selected mounting nozzle to perform an extending operation downward in the Z-axis direction and to perform a withdrawing operation upward in the Z-axis direction. The mounting head 33 includes a Q-axis rotation driving mechanism 49 (refer to FIG. 2) which rotationally drives the selected mounting nozzle individually around the Z-axis. The driving mechanisms 45 to 49 may use servomotors as driving sources, for example.

The camera device 19 is provided between the board conveyance device 13 and the component supply device 15 in the Y-axis direction. The camera device 19 is arranged above the frame section 35 to be capable of imaging upward. The imaging position in the present example is set to the space above the camera device 19. The camera device 19 images the electronic component which is sucked by the mounting nozzle which passes the imaging position from below.

Figure 2:
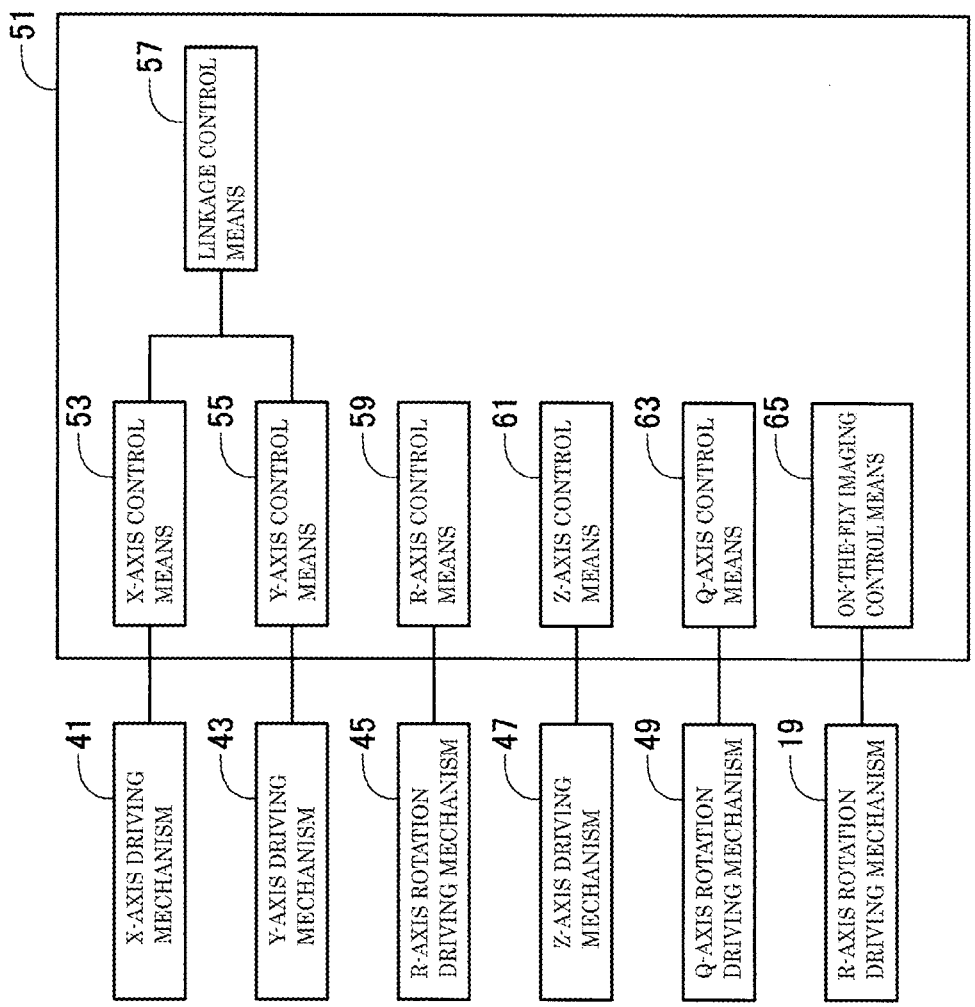
FIG. 2 is a functional block diagram for explaining the control functionality relating to component mounting work of a control computer.

A control section 51 illustrated in FIG. 2 is connected to the board conveyance device 13, the component supply device 15, the head driving mechanism 17, and the camera device 19 via a communication cable. The control section 51 acquires various information from the devices 13 to 19, and executes computations, determinations, and the like based on the acquired information. The control section 51 controls the operations of the devices 13 to 19, as appropriate, based on the computation results and the determination results. In the component mounting machine 10 of the present example, the component mounting work is controlled by the control section 51. An operation device 29 (refer to FIG. 1) is provided on a front end portion of a top portion cover in the component mounting machine 10. An operator confirms the information which is output to the operation device 29 by the control section 51 and is capable of performing the necessary operations and setting on the operation device 29.

In the component mounting machine 10 of the configuration described above, the mounting work in which the mounting head 33 is driven to mount the electronic component of the supply position onto a mounting position on the circuit board is executed repeatedly based on the control of the control section 51. Specifically, first, the head driving mechanism 17 causes the mounting head 33 to move to above the supply position of the feeder 25 to which the electronic component to be mounted is supplied. The mounting head 33 sucks the electronic component of the supply position using the mounting nozzle. Next, the head driving mechanism 17 causes the mounting head 33 to move to the imaging position above the camera device 19. The camera device 19 images the state of the electronic component being sucked to the mounting nozzle from below. Next, the head driving mechanism 17 causes the mounting head 33 to move to above the circuit board which is positioned at a stopping position by the board conveyance device 13. The control section 51 corrects the suction position of the electronic component which is held by the mounting nozzle based on the imaging data of the camera device 19 until the electronic component is mounted onto the mounting position of the circuit board. The mounting head 33 drives the Z-axis driving mechanism 47 and causes the mounting nozzle to perform an extending operation downward in the Z-axis direction. When the electronic component makes contact with the mounting position of the circuit board, the mounting head 33 cancels the negative pressure of the mounting nozzle, and releases the electronic component to mount the electronic component onto the circuit board.

FIG. 2 is a functional block diagram for explaining the control functionality relating to the component mounting work of the control section 51 with which the component mounting machine 10 is provided. The control section 51 is configured such that the main constituent thereof is a computer, and is provided with a computation circuit such as a CPU, and a storage device such as a RAM or a ROM. The control section 51 includes an X-axis control means 53, a Y-axis control means 55, and a linkage control means 57. The X-axis control means 53 controls the X-axis driving mechanism 41 to change the movement speed of the mounting head 33 in the X-axis direction. The Y-axis control means 55 controls the Y-axis driving mechanism 43 to change the movement speed of the mounting head 33 in the Y-axis direction. The linkage control means 57 causes the X-axis control means 53 and the Y-axis control means 55 to operate in a linked manner, and causes the mounting head 33 to move to an arbitrary position above the frame section 35. The control section 51 includes an R-axis control means 59 which controls the R-axis rotation driving mechanism 45, a Z-axis control means 61 which controls the Z-axis driving mechanism 47, and a Q-axis control means 63 which controls the Q-axis rotation driving mechanism 49. The control section 51 includes an on-the-fly imaging control means 65 which awaits the timing at which the mounting nozzle of the mounting head 33 passes over the imaging position to cause the camera device 19 to perform the imaging.

Figure 3:
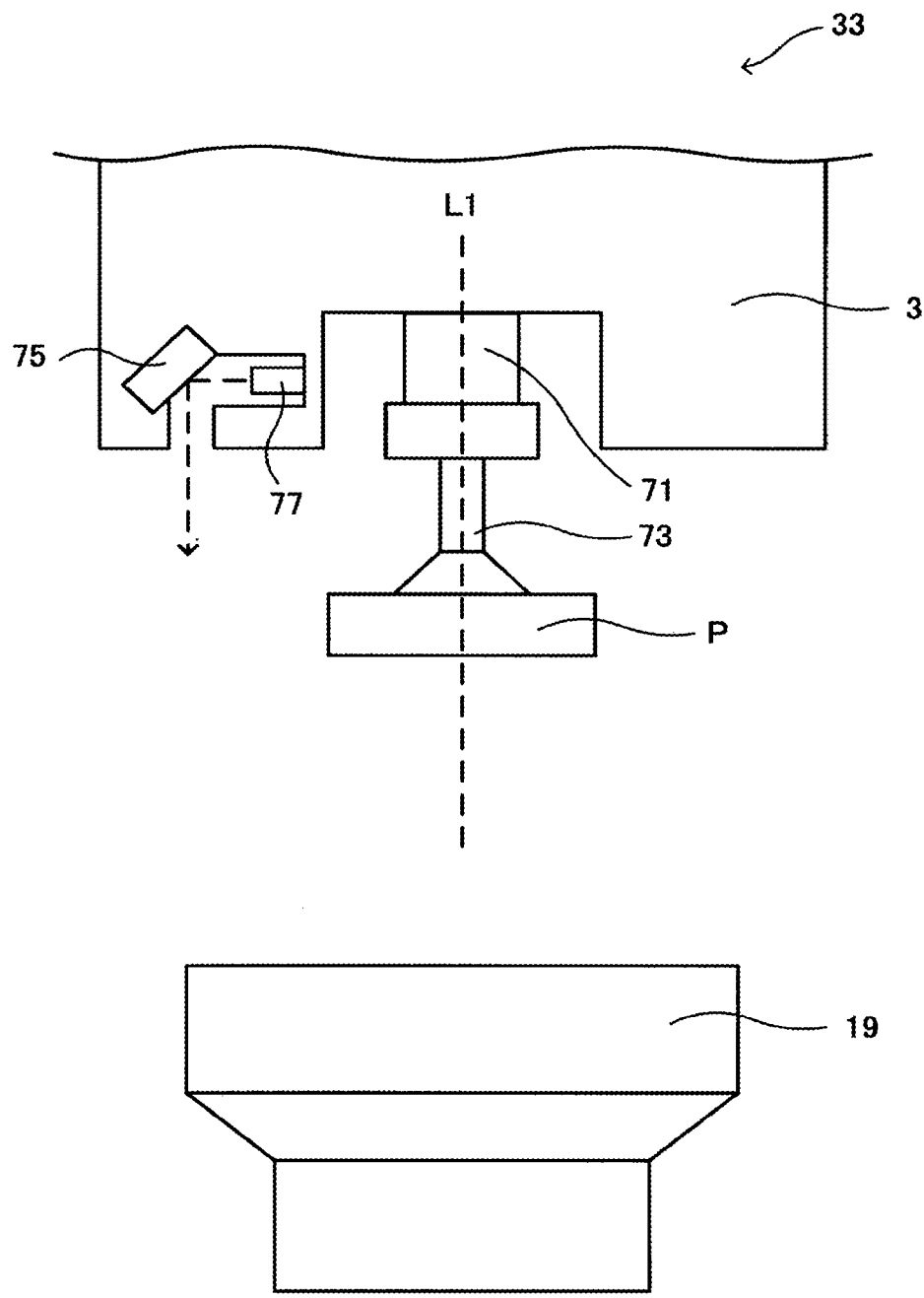
FIG. 3 is a side surface view schematically illustrating a portion of a mounting head.

Next, description will be given of the control method of the mounting head 33 during the component mounting work of the control section 51. In the following description, in order to facilitate comprehension of the content of the description, the mounting head 33 is configured such that there is only one mounting nozzle held by the nozzle holder 37, and consideration will be given only to the component mounting work onto the circuit board which is conveyed by the first conveyance device 21. FIG. 3 is a side surface view schematically illustrating a portion of the mounting head 33. As illustrated in FIG. 3, a lifting and lowering shaft 71 which is lifted and lowered in the Z-axis direction in accordance with the driving of the Z-axis driving mechanism 47 (refer to FIG. 2) is attached to the nozzle holder 37 of the mounting head 33. A mounting nozzle 73 which sucks an electronic component P is held on the bottom end of the lifting and lowering shaft 71 in a state in which a suction port is open facing downward along a Q-axis L1. The Q-axis L1 is an axial line which passes through the center of the lifting and lowering shaft 71 and is parallel to the Z-axis direction. The lifting and lowering shaft 71 and the mounting nozzle 73 rotate around the Q axis L1 in accordance with the driving of the Q-axis rotation driving mechanism 49 (refer to FIG. 2).

Fiducial marks 75 which serve as a reference during the recognition of the position of the electronic component P are provided on the bottom face of the nozzle holder 37. The fiducial marks 75 have a mirror surface, and are fixed in a state of being inclined by a predetermined angle in relation to the Q-axis L1 (the Z-axis direction). The nozzle holder 37 is provided with a light source 77 which irradiates a light toward the fiducial marks 75. The fiducial marks 75 reflect the light which is irradiated from the light source 77, and cause the reflected light to be imaged by the camera device 19 together with the electronic component P.

Figure 4:
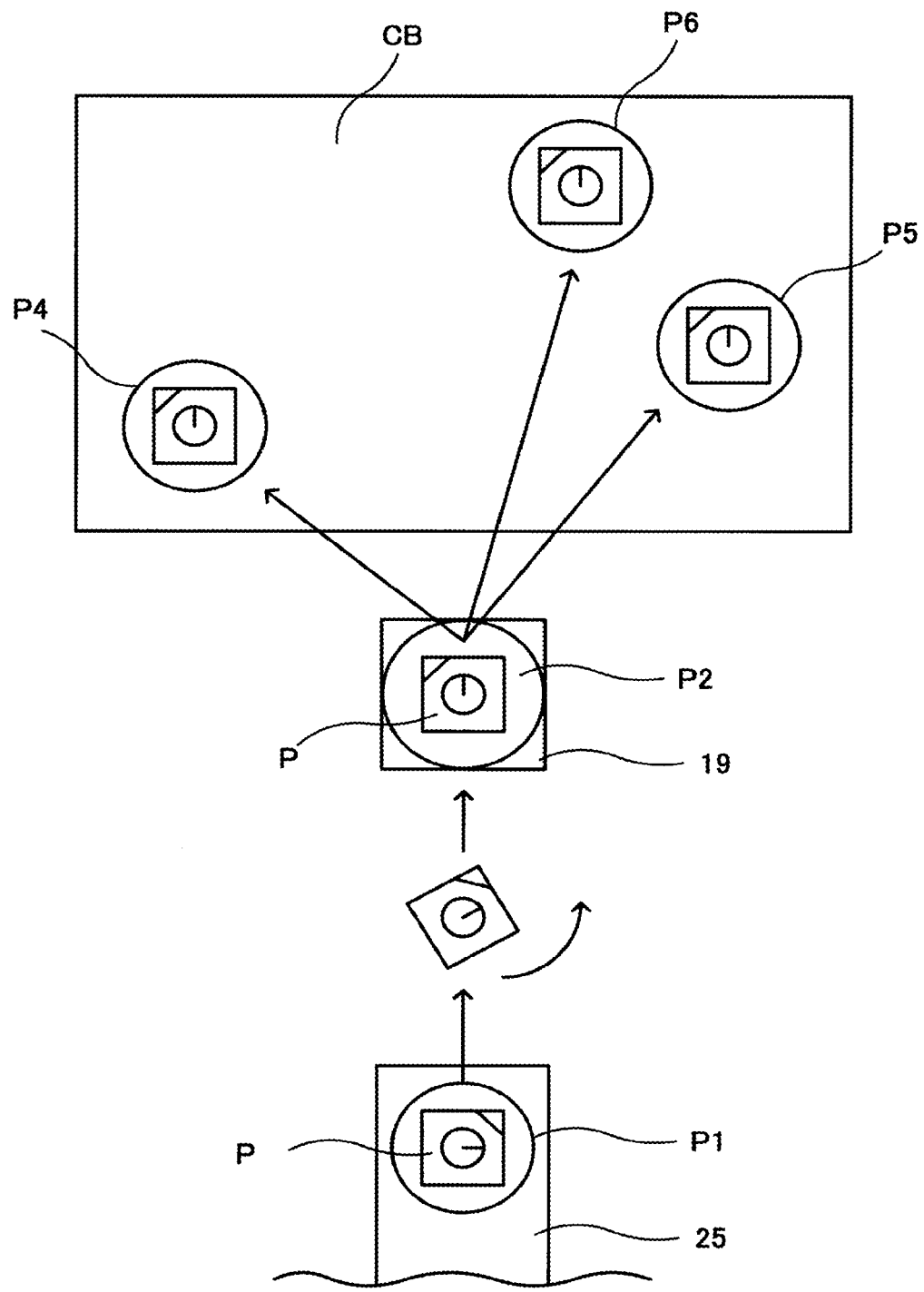
FIG. 4 is a diagram schematically illustrating a portion relating to the component mounting work in the component mounting machine, and is a plan view illustrating a case in which 90° Q-axis rotation is performed before imaging.

FIG. 4 is a plan view schematically illustrating a portion relating to the component mounting work in the component mounting machine 10. FIG. 4 illustrates a supply position P1 of one of the feeders 25 among the plurality of feeders 25 with which the component supply device 15 (refer to FIG. 1) is provided, an imaging position P2 of the camera device 19, and three mounting positions P4 to P6 of a circuit board CB. When the mounting head 33 (the mounting nozzle 73) moves from the supply position P1 to each of the mounting positions P4 to P6, the control section 51 compares the time required for the movement from the supply position P1 to the imaging position P2 with the time required for the movement from the imaging position P2 to the mounting positions P4 to P6, and determines the timing at which to start the Q-axis rotation of the mounting nozzle 73.

In the description hereinafter, the time required for the movement from the supply position P1 to the imaging position P2 will be referred to as a first required time T1. The time required for the movement from the imaging position P2 to each of the mounting positions P4 to P6 will be referred to as a second required time T2. The mounting positions P4 to P6 are distanced further from the imaging position P2 in this order. The time required for the mounting nozzle 73 to subject the sucked electronic component P to Q-axis rotation by a predetermined rotational angle will be referred to as a rotation time T3.

The time from when the electronic component P is sucked at the supply position P1 until a state is assumed in which the Q-axis rotation of the electronic component P at each of the mounting positions P4 to P6 is completed will be referred to as a mounting time T4. After the Q-axis rotation is completed, the mounting head 33 corrects the shifting of the suction position or the like of the electronic component P in relation to the mounting nozzle 73 based on the imaging results of the camera device 19, and lowers the mounting nozzle 73 in the Z-axis direction to mount the electronic component P onto the circuit board CB. Since the correction processing of the positional shifting and the working time in which the mounting nozzle 73 is lowered are not influenced by the start timing of the Q-axis rotation, these are excluded from the comparison targets in the following description. Therefore, the mounting time T4 described above does not include the time of the correction process or the lowering process, and refers to a time until the reaching of each of the mounting positions P4 to P6 in a case in which the Q-axis rotation is completed before reaching the mounting positions P4 to P6. In a case in which the Q-axis rotation is completed after reaching each of the mounting positions P4 to P6, the mounting time T4 refers to the time until the Q-axis rotation is completed.

For example, as illustrated in FIG. 4, consideration will be given to a case in which the electronic component P is subjected to Q-axis rotation by 90 degrees counterclockwise from the rotational angle at which the electronic component P is sucked at the supply position P1, and the electronic component P is mounted. The first required time T1 is 80 ms (milliseconds). The second required time T2 from the imaging position P2 to the mounting position P4 is 50 ms. The second required time T2 from the imaging position P2 to the mounting position P5 is 100 ms. The second required time T2 from the imaging position P2 to the mounting position P6 is 150 ms. The rotation time T3 required for the mounting nozzle 73 to be subjected to Q-axis rotation by 90° is 102 ms.

Mounting Time in a Case in which Q-Axis Rotation (90°) is Started before Imaging First description will be given of the mounting time T4 in a case in which the Q-axis rotation is started before the imaging is carried out by the camera device 19 at the imaging position P2. Here, the component mounting machine 10 of the present example carries out the imaging of the electronic component P in a state in which the Q-axis rotation is stopped. Therefore, considering that the imaging process may not be started until the Q-axis rotation is completed, it is preferable to start the Q-axis rotation straight after sucking the electronic component P at the supply position P1. Therefore, the start timing is set to start straight after the electronic component P is sucked.

Whereas the first required time T1 is 80 ms, the rotation time T3 is 102 ms. Since the rotation time T3 is long in comparison to the first required time T1, even if the Q-axis rotation is started from the supply position P1, it is necessary for the mounting nozzle 73 to continue carrying out the Q-axis rotation after reaching the imaging position P2, and the camera device 19 assumes a state of waiting for the start of the imaging process until the rotation is completed. Therefore, the camera device 19 carries out the imaging of the electronic component P after the rotation time T3 (102 ms) from when the mounting nozzle 73 starts moving from the supply position P1. The mounting nozzle 73 reaches the mounting position P4 after the second required time T2 (50 ms) from after the imaging is completed. In this case, the mounting time T4 of the mounting position P4 is 152 ms (=102 ms+50 ms) (refer to FIG. 6). Similarly, the mounting time T4 of the mounting position P5 is 202 ms (=102 ms+100 ms). The mounting time T4 of the mounting position P6 is 252 ms (=102 ms+150 ms).

Mounting Time in a Case in which Q-Axis Rotation (90°) is Started after Imaging

Figure 5:
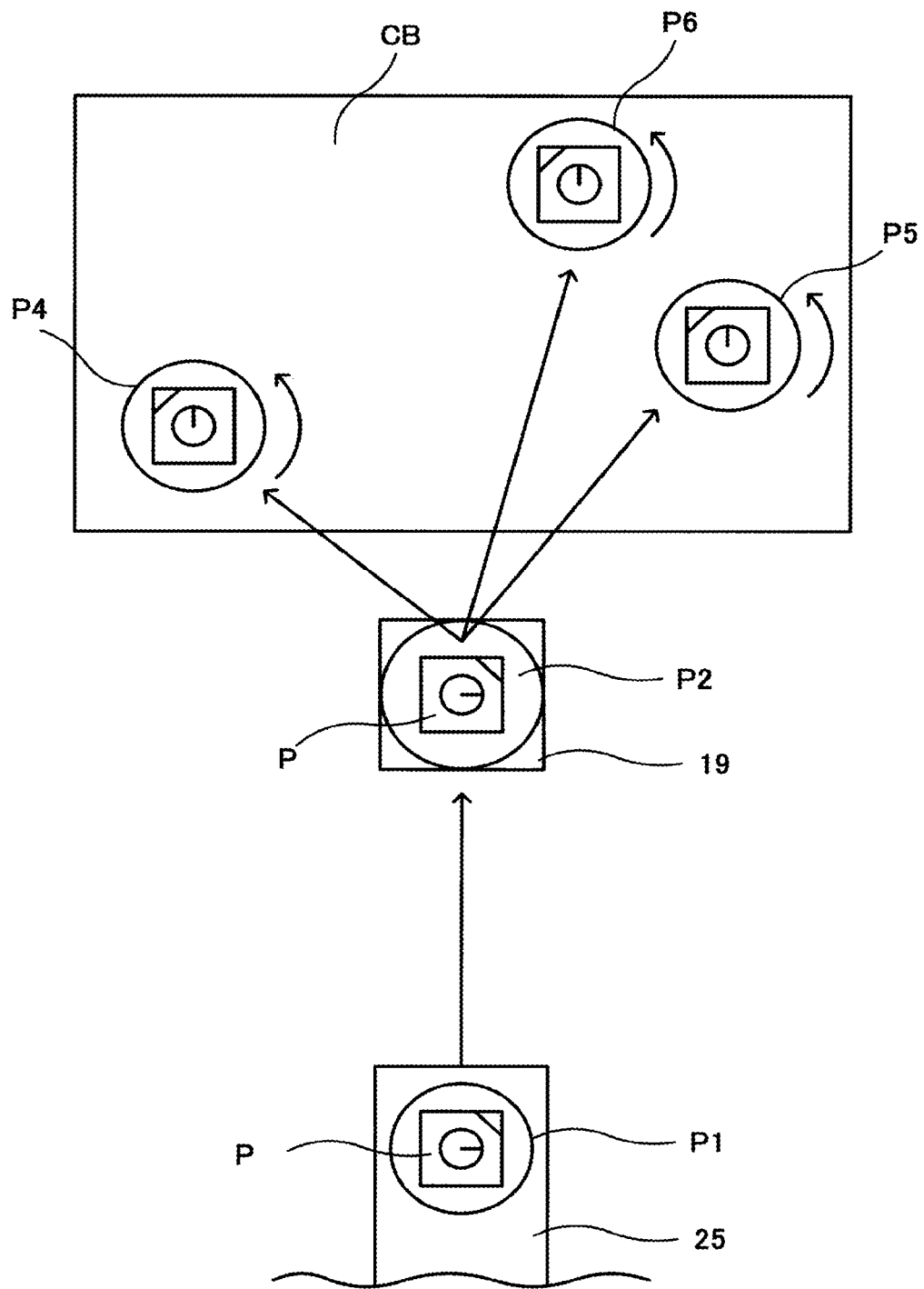
FIG. 5 is a plan view illustrating a case in which 90° Q-axis rotation is performed after imaging.

Next, as illustrated in FIG. 5, description will be given of the mounting time T4 in a case in which the Q-axis rotation is started after the imaging is carried out by the camera device 19. First, since the Q-axis rotation is not carried out from the supply position P1 to the imaging position P2, the mounting nozzle 73 starts moving from the supply position P1, completes the imaging after the first required time T1 (80 ms), and enters a state of being capable of moving to each of the mounting positions P4 to P6.

In the case of the mounting position P4, whereas the second required time T2 is 50 ms, the rotation time T3 is 102 ms. Since the rotation time T3 is long in comparison to the second required time T2, even if the Q-axis rotation is started from the timing at which the movement from the imaging position P2 is started, it is necessary for the mounting head 33 to continue carrying out the Q-axis rotation after reaching the mounting position P4, and a state of waiting for the start of the process of correcting the shifting of the suction position of the mounting nozzle 73 is assumed until the rotation is completed. Therefore, in the mounting nozzle 73, the rotation time T3 (102 ms) after starting the movement from the imaging position P2 becomes the ending time point of the mounting time T4. In this case, the mounting time T4 of the mounting position P4 is 182 ms (=80 ms+102 ms) (refer to FIG. 6). Similarly, in the case of the mounting position P5, the rotation time T3 (102 ms) is long in comparison to the second required time T2 (100 ms). Therefore, the mounting time T4 of the mounting position P5 is 182 ms (=80 ms+102 ms).

Meanwhile, in the case of the mounting position P6, which is a long distance from the imaging position P2 in comparison to the mounting positions P4 and P5, the rotation time T3 (102 ms) is short in comparison to the second required time T2 (150 ms). When th Q-axis rotation is started from the timing at which the movement from the imaging position P2 is started, the Q-axis rotation is completed before the mounting head 33 reaches the mounting position P6. In other words, no wait time arises until the process of correcting the shifting of the suction position of the mounting nozzle 73 is stated. Therefore, in the mounting nozzle 73, the second required time T2 (150 ms) after starting the movement from the imaging position P2 becomes the ending time point of the mounting time T4. The mounting time T4 of the mounting position T6 is 230 ms (=80 ms+150 ms).

As illustrated in FIG. 6, the mounting time T4 is shortened by carrying out the Q-axis rotation in whichever of the first required time T1 and the second required time T2 is the longer required time. For example, in a case in which the XY coordinate positions of the imaging position P2 and the mounting positions P4 to P6, the movement speed of each of the X-axis direction and the Y-axis direction of the mounting head 33, and the like are set in control data (a production job) in which the types of electronic component to be mounted onto the circuit board CB and the like are set, the control section 51 computes the first required time T1 and the second required time T2 based on these items of data. The control section 51 computes the difference between the required times (first required time T1−second required time T2) (refer to FIG. 6). In the mounting work of the mounting position P4 for which the computation result is positive, the control section 51 carries out the control of starting the Q-axis rotation before the imaging. In the mounting work of the mounting positions P5 and P6 for which the difference between the required times is negative, the control section 51 carries out the control of starting the Q-axis rotation after the imaging. Accordingly, the control section 51 is capable of shortening the mounting time T4 of each of the mounting positions to improve the production efficiency.

The control section 51 is capable of carrying out the determination of the start timing of the Q-axis rotation described above, as appropriate. For example, the control section 51 may determine the timing of the Q-axis rotation of all of the mounting work (each sequence of mounting the electronic component P onto the circuit board CB) at a timing at which the type of the circuit board CB to be produced is changed. Alternatively, the control section 51 may carry out the mounting work while computing and determining the start timing of the Q-axis rotation of each sequence, for example. Alternatively, in a case in which the set values of the movement speed of the mounting head 33 are changed by the operator, the control section 51 may change the start timing each time.

Here, as in the present example, in a case in which the mounting time T4 is not considered in the component mounting machine 10 which carries out the imaging of the electronic component P and the Q-axis rotation of the electronic component P, it is preferable to complete the Q-axis rotation before carrying out the imaging. This is because, for example, it becomes possible to detect and correct the error which arises through the operations (the Q-axis rotation and the like) carried out before the imaging using the imaging data of the camera device 19. Therefore, in a case in which the mounting time T4 is the same whether the start timing of the Q-axis rotation is changed to before or after the imaging, the control section 51 prioritizes carrying out the Q-axis rotation before the imaging. For example, in a case in which the first required time T1 and the second required time T2 are the same time, the control section 51 carries out the Q-axis rotation before the imaging. Alternatively, in a case in which the first required time T1 is long in comparison to the rotation time T3, even in a case in which the second required time T2 is long in comparison to the first required time T1, the control section 51 prioritizes carrying out the Q-axis rotation before the imaging. Accordingly, by prioritizing carrying out the Q-axis rotation before the imaging to perform the process, the control section 51 becomes capable of improving the precision of the process of mounting the electronic component P onto the circuit board CB while achieving a shortening in the mounting time T4.

Figure 7:
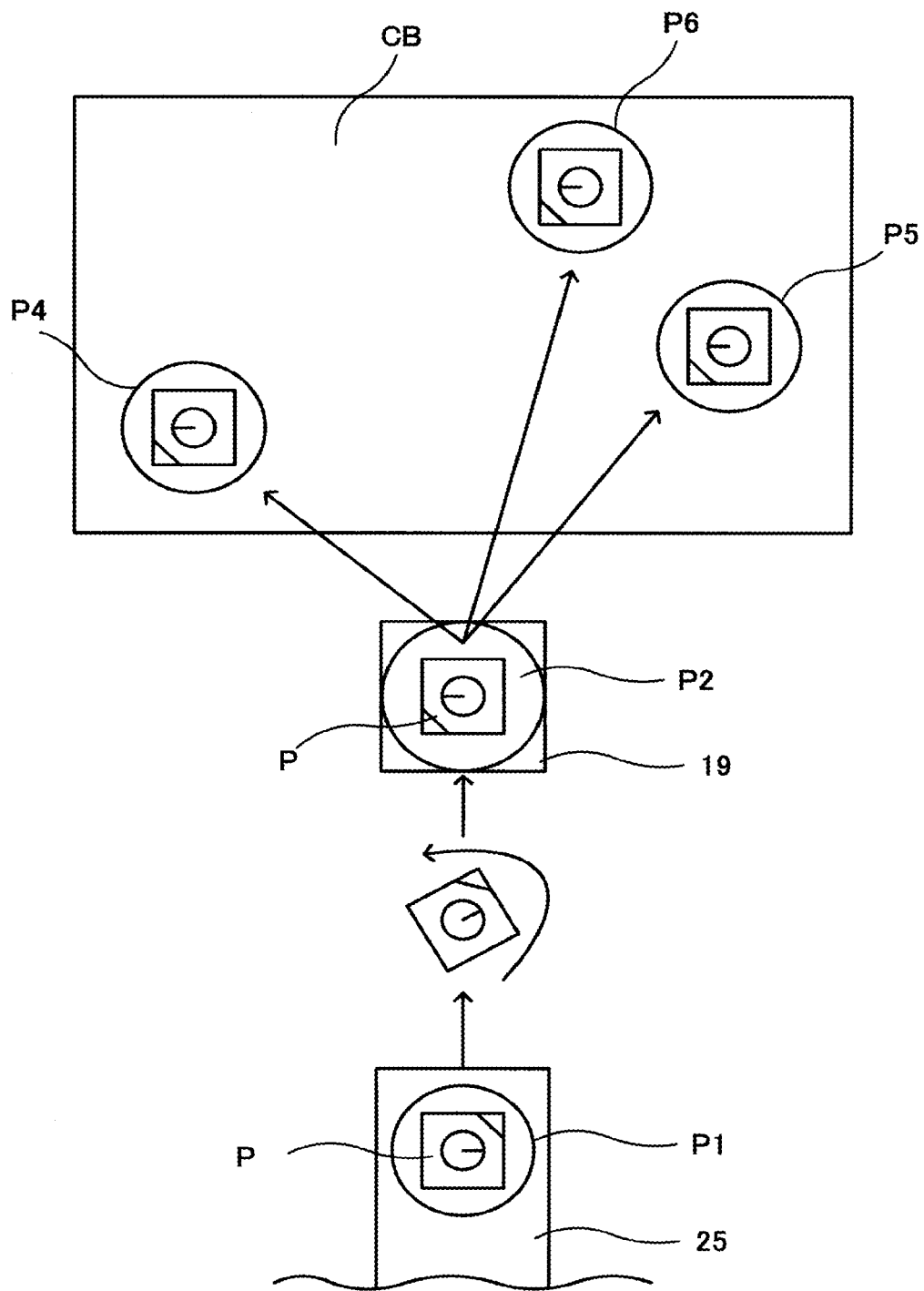
FIG. 7 is a plan view illustrating a case in which 180° Q-axis rotation is performed before imaging.

Next, description will be given of the control in which the mounting nozzle 73 is subjected to the Q-axis rotation both before and after imaging. The rotational angle of the Q-axis rotation differs according to the angle of the electronic component P of the supply position P1 and the angle of the electronic component P when mounting to the mounting positions P4 to P6. In a sequence in which the rotational angle is large, there is a case in which carrying out the Q-axis rotation divided between before and after the imaging is more valid than carrying out the Q-axis rotation in one of the first required time T1 and the second required time T2. In the following description, as illustrated in FIG. 7, a case will be considered in which the electronic component P is subjected to Q-axis rotation by 180° counterclockwise from the rotational angle at which the electronic component P is sucked at the supply position P1 to be mounted. A rotation time T8 which is required for subjecting the mounting nozzle 73 to Q-axis rotation by 180° is 134 ms. The first required time T1, the second required time T2, and the rotation time T3 are the same values as those described in FIGS. 4 and 5 described above.

Mounting Time in a Case in which Q-Axis Rotation (180°) is Started before Imaging First, description will be given of the mounting time T4 in a case in which the Q-axis rotation is started before the imaging. Since the rotation time T8 (134 ms) is long in comparison to the first required time T1 (80 ms), even if the Q-axis rotation is started from the supply position P1, the Q-axis rotation is not completed by the imaging position P2, and the camera device 19 carries out the imaging of the electronic component P after the rotation time T8 from when the mounting nozzle 73 starts moving from the supply position P1. The mounting nozzle 73 reaches the mounting position P4 after the second required time T2 (50 ms) from after the imaging is completed. In this case, the mounting time T4 of the mounting position P4 becomes 184 ms (=134 ms+50 ms) (refer to FIG. 10). Similarly, the mounting time T4 of the mounting position P5 is 234 ms (=134 ms+100 ms). The mounting time T4 of the mounting position T6 is 284 ms (=134 ms+150 ms).

Figure 8:
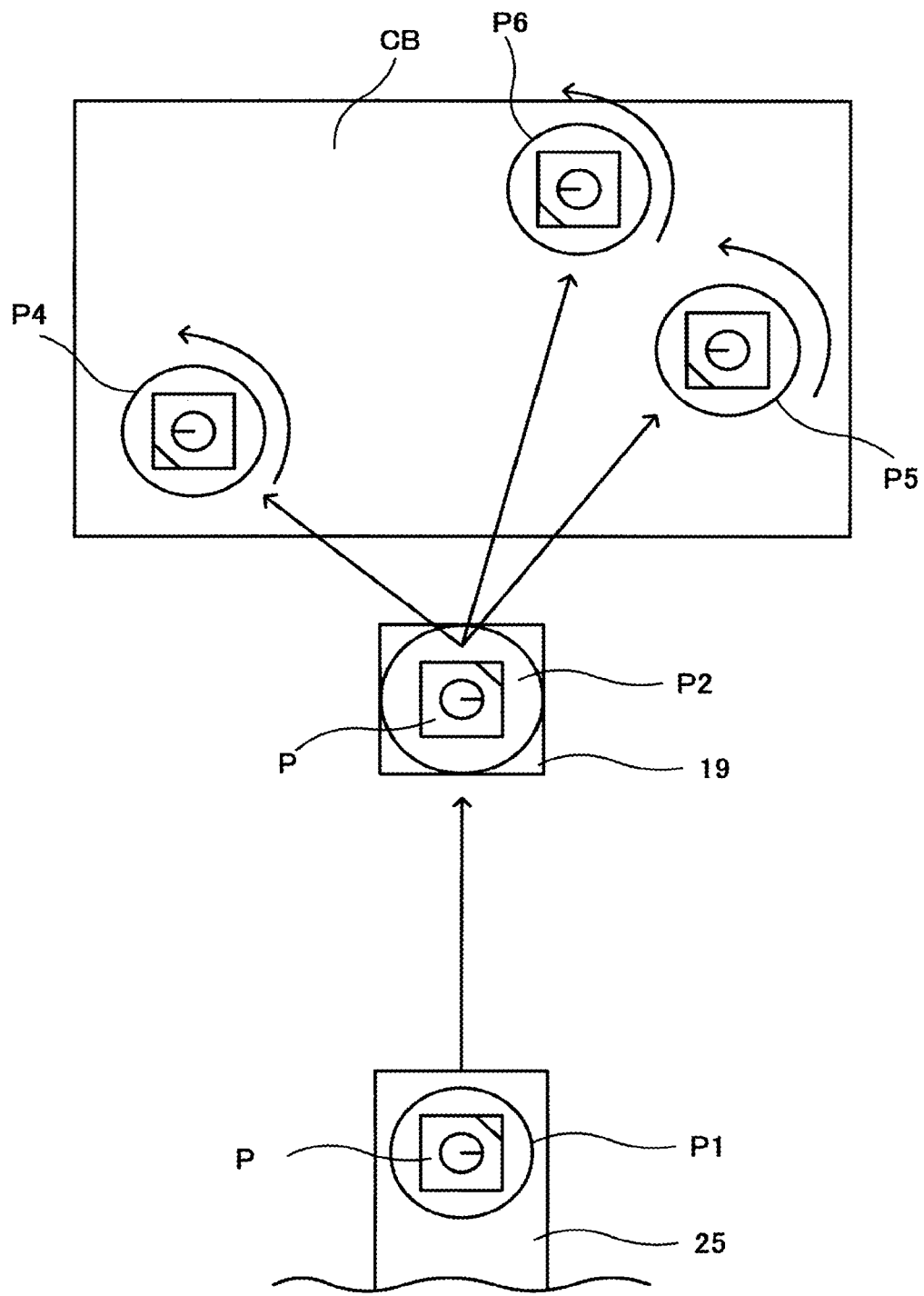
FIG. 8 is a plan view illustrating a case in which 180° Q-axis rotation is performed after imaging.

Mounting Time in a Case in which Q-Axis Rotation (180°) is Started after Imaging Next, as illustrated in FIG. 8, description will be given of the mounting time T4 in a case in which the Q-axis rotation is started after the imaging. Since the Q-axis rotation is not carried out from the supply position P1 to the imaging position P2, the mounting nozzle 73 starts moving from the supply position P1, completes the imaging after the first required time T1 (80 ms), and enters a state of being capable of moving to each of the mounting positions P4 to P6. In the case of the mounting position P4, the rotation time T8 (134 ms) is long in comparison to the second required time T2 (50 ms). Therefore, even if the Q-axis rotation is started from the timing at which the imaging is completed and the movement from the imaging position P2 is started, the mounting head 33 continues to carryout the Q-axis rotation even after reaching the mounting position P4. In the mounting nozzle 73, the rotation time T8 (134 ms) after starting the movement from the imaging position P2 becomes the ending time point of the mounting time T4. The mounting time T4 of the mounting position P4 is 214 ms (=80 ms+134 ms) (refer to FIG. 10). Similarly, in the case of the mounting position P5, the rotation time T8 (134 ms) is long in comparison to the second required time T2 (100 ms). Therefore, the mounting time T4 of the mounting position P5 is 214 ms (=80 ms+134 ms).

Meanwhile, in the case of the mounting position P6, which is a long distance from the imaging position P2, the rotation time T8 (134 ms) is short in comparison to the second required time T2 (150 ms). The Q-axis rotation is completed before the mounting head 33 reaches the mounting position P6. Therefore, the mounting time T4 of the mounting position T6 is 230 ms (=80 ms+150 ms).

Figure 9:
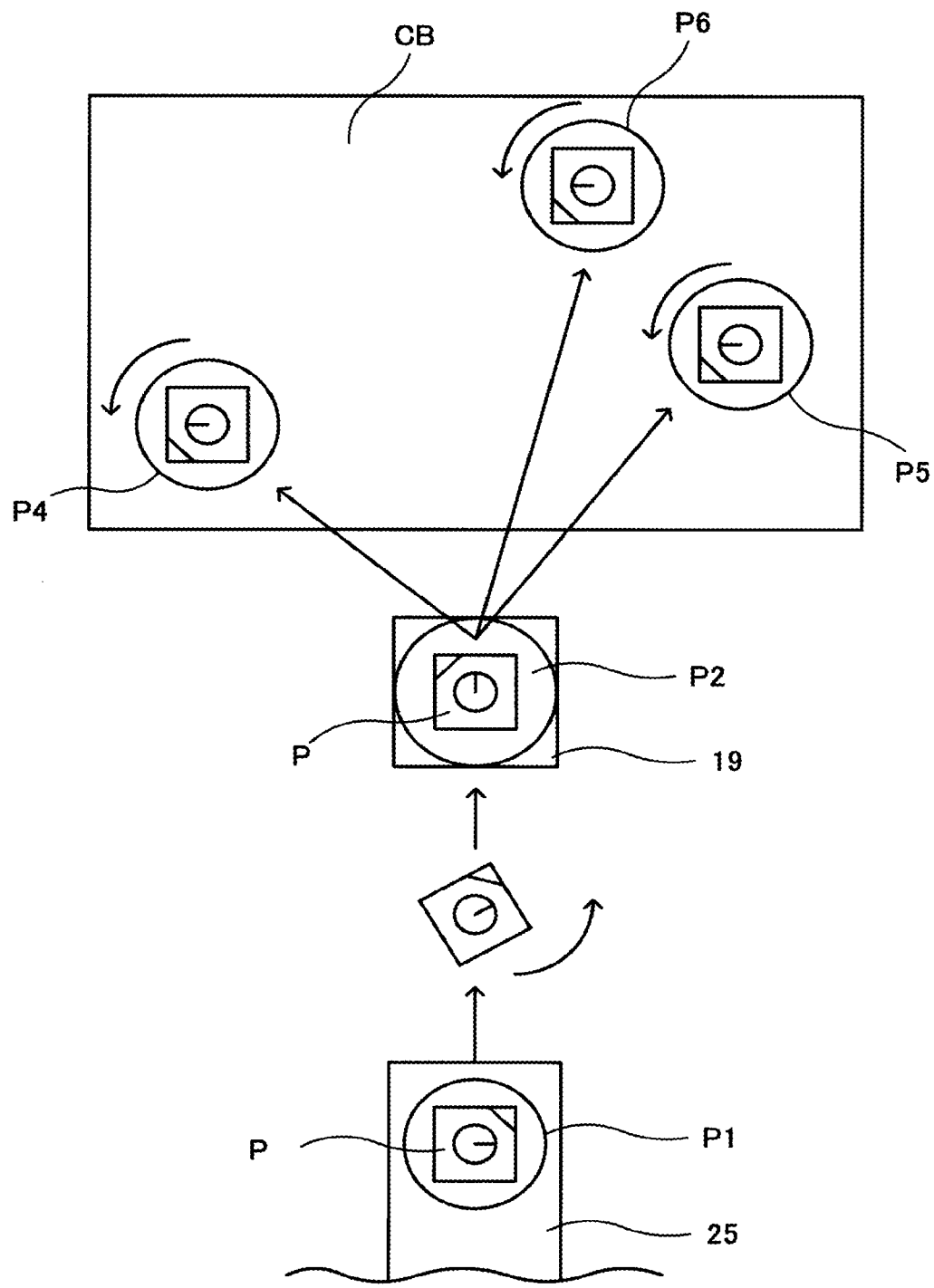
FIG. 9 is a plan view illustrating a case in which 90° Q-axis rotation is performed before imaging, and 90° Q-axis rotation is performed after imaging.

Mounting Time in a Case in which Q-Axis Rotation (90°) is Started Both before Imaging and after Imaging Next, as illustrated in FIG. 9, description will be given of the mounting time T4 in a case in which the Q-axis rotation is carried out divided into before and after the imaging process. The mounting nozzle 73 is subjected to Q-axis rotation by 90° before the imaging, and rotates by the remaining 90° after the imaging. The time required for the mounting nozzle 73 to rotate by 90° is the rotation time T3, which is 102 ms. Incidentally, the reason the rotation time T3 of 90° is not half of the time of the rotation time T8 of 180° is because the Q-axis rotation of the mounting nozzle 73 requires time for acceleration and deceleration, and this time is taken into consideration.

In a case in which 90 degree rotation is performed before the imaging, since the rotation time T3 (102 ms) is long in comparison to the first required time T1 (80 ms), the camera device 19 carries out the imaging of the electronic component P after the rotation time T3 from when the mounting nozzle 73 starts moving from the supply position P1. In the case of the mounting position P4, in a case in which the remaining 90° rotation is performed after the imaging, since the rotation time T3 is long in comparison to the second required time T2 (50 ms), in the mounting nozzle 73, the rotation time T3 after starting the movement from the imaging position P2 becomes the ending time point of the mounting time T4. In this case, the mounting time T4 of the mounting position P4 becomes 204 ms (=102 ms+102 ms) (refer to FIG. 10). Similarly, the mounting time T4 of the mounting position P5 is 204 ms (=102 ms+102 ms). Meanwhile, in the case of the mounting position P6, the rotation time T3 is short in comparison to the second required time T2 (150 ms). Therefore, the mounting time T4 of the mounting position T6 is 252 ms (=102 ms+150 ms).

As illustrated in FIG. 10, the mounting time T4 is determined according to the start timing of the Q-axis rotation. The control section 51 selects the condition with the shortest time among the mounting times T4 of before the imaging, after the imaging, and before and after the imaging. In a case in which the time of one of either the first required time T1 or the second required time T2 is long in comparison to the rotation time T8, for example, the control section 51 carries out the Q-axis rotation in the conditions under which the required time is longer. In the mounting position P6, the second required time T2 (150 ms) is long in comparison to the rotation time T8 (134 ms) and is suitable for this condition. Therefore, the control section 51 carries out the Q-axis rotation after the imaging for the mounting position P6.

Next, in the cases of the mounting positions P4 and P5 in which the first required time T1 and the second required time T2 are short in comparison to the rotation time T8, the control section 51 computes the differences between the rotation times T3 and T8 and the first and second required times T1 and T2, and determines the conditions under which the delay time that accompanies the Q-axis rotation is the shortest. Specifically, the control section 51 calculates a value obtained by subtracting the first required time T1 from the rotation time T8 as the delay time arising from carrying out the Q-axis rotation before the imaging (refer to Equation (1) in the drawing). The control section 51 calculates a value obtained by subtracting the second required time T2 from the rotation time T8 as the delay time arising from carrying out the Q-axis rotation after the imaging (refer to Equation (2) in the drawing).

The control section 51 calculates a value obtained by subtracting the first required time T1 from the rotation time T3 as the delay time arising from carrying out the Q-axis rotation by 90° before the imaging (refer to Equation (3) in the drawing). The control section 51 calculates a value obtained by subtracting the second required time T2 from the rotation time T3 as the delay time arising from carrying out the Q-axis rotation by the remaining 90° after the imaging (refer to Equation (4) in the drawing). The control section 51 adds the results of Equation (3) and Equation (4) described above to calculate the delay time arising from rotating 180° divided into before and after the imaging (refer to Equation (5) in the drawing).

The control section 51 compares the values of Equation (1), Equation (2), and Equation (5) described above to determine the conditions under which the delay time that accompanies the Q-axis rotation is the shortest. In the case of the mounting position P4, the result of Equation (1) is 54 ms, the result of equation (2) is 84 ms, and the result of equation (5) is 94 ms. Therefore, the control section 51 carries out the Q-axis rotation before the imaging for the mounting position P4.

Meanwhile, in the case of the mounting position P5, the result of Equation (1) is 54 ms, the result of equation (2) is 34 ms, and the result of equation (5) is 24 ms. Therefore, the control section 51 carries out the Q-axis rotation before and after the imaging for the mounting position P5. Accordingly, the control section 51 becomes capable of more reliably shortening the mounting time T4 of each of the mounting positions P4 to P6 to improve the production efficiency.

The angles (90° and 180°) of the Q-axis rotation described above are exemplary, and may be changed as appropriate. For example, the control section 51 may carry out control in which the 180° Q-axis rotation is performed as a 100° rotation before the imaging and an 80° rotation after the imaging. Here, ideally, it is preferable for the camera device 19 to be capable of imaging at any angle around the Q-axis L1. However, the imaging of the electronic component P may be carried out in a state in which the Q-axis rotation is stopped for reasons such as to simplify the image processing which detects the fiducial marks 75 (refer to FIG. 3) for determining the shifting in the suction position of the electronic component P in relation to the mounting nozzle 73, to keep the electronic component P within a predetermined imaging region of the camera device 19, or the like. Therefore, in the camera device 19 of the present example, a plurality of imaging angles are set for every angle equally spaced in relation to the rotational angle around the Q-axis L1 (the Z-axis), and the camera device 19 is configured to image the electronic component P in a state of being held at any one of the imaging angles. For example, in a case in which the angle of the electronic component P of the supply position P1 illustrated in FIG. 4 is set to 0° (zero), the camera device 19 is set to image the electronic component P which is rotated to any one of the angles 90°, 180°, and 270° at a 90° interval around the Q-axis L1.

Therefore, in a case in which the Q-axis rotation is carried out divided into before and after the imaging, the control section 51 subjects the mounting nozzle 73 to Q-axis rotation by any one of the predetermined imaging angles (90°, 180°, and 270°) in the movement from the supply position P1 to the imaging position P2. In the movement from the imaging position P2 to the mounting positions P4 to P6, the control section 51 subjects the mounting nozzle 73 to the Q-axis rotation by the remaining rotational angle. In the case of 270°, the control section 51 may cause rotation by −90° (90° clockwise).

For example, in a case in which the electronic component P is rotated by 110° and mounted onto the circuit board CB, the control section 51 subjects the electronic component P to the Q-axis rotation by 90° before the imaging, and by the remaining 20° after the imaging. In this case, the control section 51 calculates a value obtained by subtracting the first required time T1 from the rotation time in which the Q-axis rotation is performed by 90° as the delay time arising from performing the Q-axis rotation before the imaging. The control section 51 calculates a value obtained by subtracting the second required time T2 from the rotation time in which the Q-axis rotation is performed by 20° as the delay time arising from performing the Q-axis rotation after the imaging. The control section 51 adds the two computation results and calculates the delay time arising from performing a 110° rotation divided into before and after the imaging.

The present example described in detail above has the following effects.

When the mounting head 33 moves from the supply position P1 of the feeder 25 to the mounting positions P4 to P6 of the circuit board CB via the imaging position P2 of the camera device 19, the control section 51 of the component mounting machine 10 compares the first required time T1 which is required for the movement from the supply position P1 to the imaging position P2 with the second required time T2 which is required for the movement from the imaging position P2 to the mounting positions P4 to P6. The control section 51 computes (refer to FIG. 6) the difference between the required times (first required time T1−second required time T2), and in the mounting work of the mounting position P4 in which the computation result is positive, the control section 51 starts the Q-axis rotation before the imaging of the camera device 19. In the mounting work of the mounting positions P5 and P6 for which difference between the required times is negative, the control section 51 starts the Q-axis rotation after the imaging. Accordingly, the control section 51 is capable of shortening the mounting time T4 of each of the mounting positions P4 to P6 to improve the production efficiency. According to the component mounting machine 10 of the present example, adjustment which shortens the first required time T1 becomes possible by optimizing the start timing of the Q-axis rotation. Therefore, it becomes possible for the component mounting machine 10 to shorten the first required time T1, that is, to shorten the inter-device physical distance between the component supply device 15 and the camera device 19 and be disposed in close proximity thereto, and a reduction in device size may be achieved.

In a case in which the first required time T1 is long in comparison to the rotation time T3, even in a case in which the second required time T2 is long in comparison to the first required time T1, the control section 51 prioritizes carrying out the Q-axis rotation before the imaging. Accordingly, the control section 51 becomes capable of achieving both a shortening in the mounting time T4 through optimization of the start timing of the Q-axis rotation, and an improvement in the processing precision of mounting the electronic component P onto the circuit board CB through prioritizing carrying out the Q-axis rotation before the imaging.

The control section 51 is configured to be capable of carrying out the Q-axis rotation divided into before and after the imaging, and selects the conditions under which the delay time is smallest among the mounting times T4 of the before the imaging, after the imaging, and before and after the imaging. Accordingly, the control section 51 becomes capable of optimization including a mode of dividing and carrying out the Q-axis rotation, and becomes capable of more reliably shortening the mounting time T4 of each of the mounting positions P4 to P6 to improve the production efficiency.

Incidentally, the mounting head 33 is an example of a movable section. The X-axis driving mechanism 41, the Y-axis driving mechanism 43, and the Q-axis rotation driving mechanism 49 are examples of a driving mechanism. The camera device 19 is an example of an imaging device. In the 180° Q-axis rotation, the time when dividing and performing the rotation by 90° before the imaging is an example of a first divided time. The time when rotating by 90° after the imaging is an example of a second divided time. The circuit board CB is an example of a target object. The electronic component P is an example of a component.

The present disclosure is not limited to the example described above, and it goes without saying that various improvements and modifications are possible within a scope that does not depart from the gist of the present disclosure. For example, in the example described above, description is given exemplifying a configuration in which there is one mounting nozzle 73 held by the nozzle holder 37 in the mounting head 33; however, it goes without saying that it is possible to optimize the start timing of the Q-axis rotation similarly in the mounting work which uses a plurality of the mounting nozzles 73. In this case, after an arbitrary one of the mounting nozzles 73 among the plurality of mounting nozzles 73 acquires the electronic component P, the control section 51 may be set to compute the first required time T1 taking into account the time required for the other mounting nozzles 73 to acquire the electronic components P.

Figure 11:
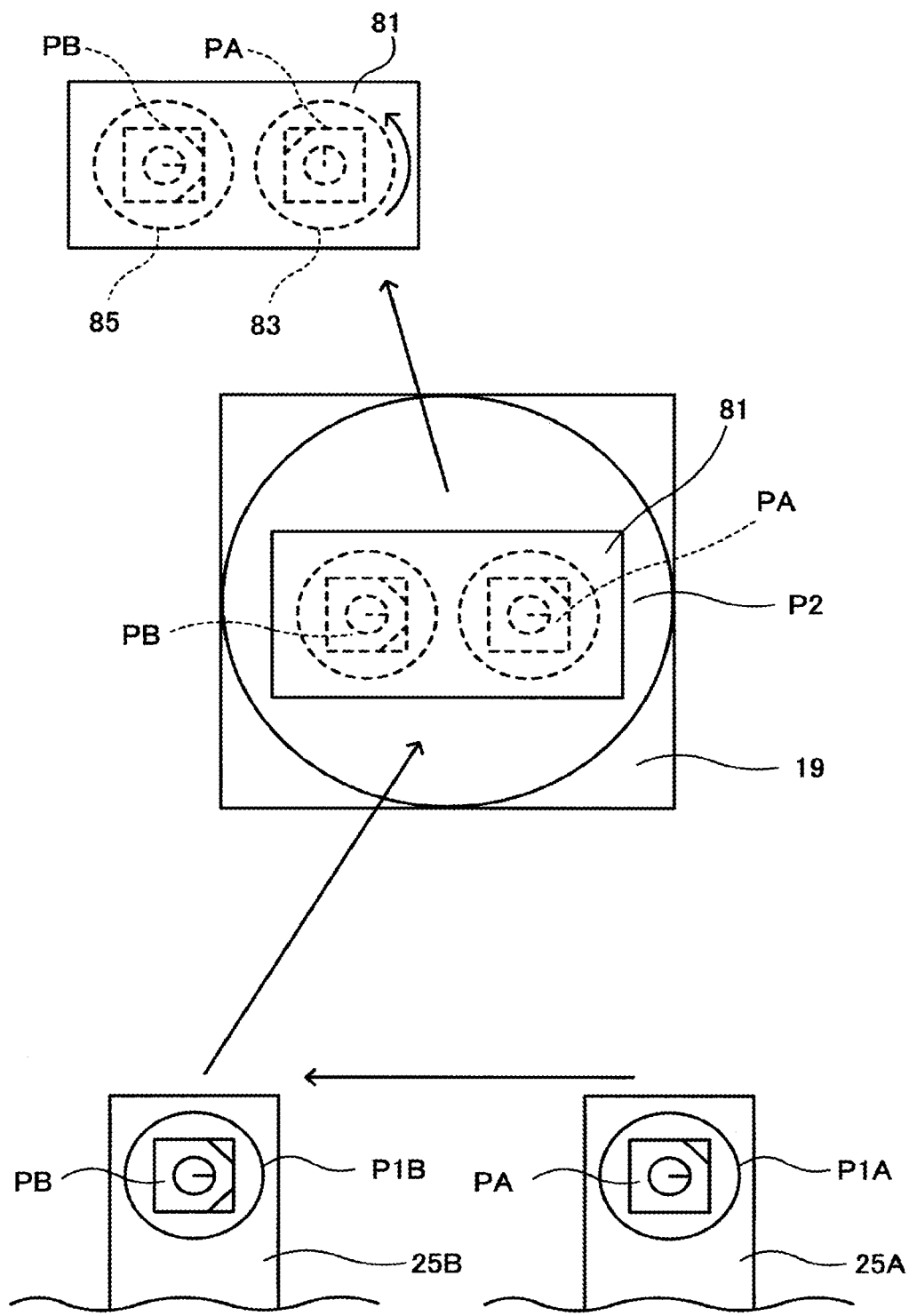
FIG. 11 is a plan view for explaining movement of a mounting head provided with two mounting nozzles in a nozzle holder, and the start timing of the Q-axis rotation.

FIG. 11 is a plan view schematically illustrating a portion relating to the component mounting work in the component mounting machine 10 in which two mounting nozzles are provided in the nozzle holder. Two mounting nozzles, a first mounting nozzle 83 and a second mounting nozzle 85, are attached to a nozzle holder 81 illustrated in FIG. 11. FIG. 11 illustrates supply positions P1A and P1B of two feeders 25A and 25B among a plurality of the feeders 25 with which the component supply devices 15 (refer to FIG. 1) is provided. The mounting head 33 (refer to FIG. 1) sucks an electronic component PA from the supply position P1A of the feeder 25A using the first mounting nozzle 83. Next, the mounting head 33 sucks an electronic component PB from the supply position P1B of the feeder 25B using the second mounting nozzle 85. After sucking the electronic component PB, the mounting head 33 images the two electronic components PA and PB in the imaging position P2 at the same time. After mounting the electronic component PB of the second mounting nozzle 85 onto a mounting position of the circuit board (not illustrated) after the imaging, the mounting head 33 mounts the electronic component PA of the first mounting nozzle 83 onto a different mounting position of the circuit board CB. For example, the electronic component PB is mounted onto the circuit board maintaining the angle at which the electronic component PB is sucked at the supply position P1B without performing the Q-axis rotation. The electronic component PA is mounted onto the circuit board after being subjected to the Q-axis rotation by 90°.

In this case, the movement time of the mounting head 33 from the supply position P1B to the imaging position P2 is included in the first required time T1 of the first mounting nozzle 83. The control section 51 includes a time required for the second mounting nozzle 85 to suck the electronic component PB after the first mounting nozzle 83 suck the electronic component PA in the first required time T1 of the first mounting nozzle 83. More specifically, the time in which the mounting head 33 moves from the supply position P1A to the supply position P1B, and the time in which the second mounting nozzle 85 is lifted and lowered in the Z-axis direction at the supply position P1B and the electronic component PB is sucked are included in the first required time T1 of the first mounting nozzle 83. This is because this time is the time in which the first mounting nozzle 83 is capable of subjecting the electronic component PA to the Q-axis rotation. Accordingly, in a case in which the plurality of mounting nozzles 83 and 85 are provided, the control section 51 is capable of determining a more appropriate start timing of the Q-axis rotation by including the time in which the mounting nozzles 83 and 85 are carrying out the respective suction work in the first required time T1 for the Q-axis rotation.

In the same manner for the process after the imaging, the control section 51 achieves an optimization including the time in which the second mounting nozzle 85 carries out the mounting work in the second required time T2 of the first mounting nozzle 83 which subsequently performs the mounting work. More specifically, the time in which the mounting head 33 moves from the imaging position P2 to the mounting position of the electronic component PB, the time requires for the second mounting nozzle 85 to mount the electronic component PB onto the mounting position of the circuit board, and the time in which the mounting head 33 moves from the mounting position of the electronic component PB to the mounting position of the electronic component PA are included in the second required time T2 of the first mounting nozzle 83. This time is the time in which the first mounting nozzle 83 is capable of subjecting the electronic component PA to the Q-axis rotation. Accordingly, the control section 51 is capable of determining a more appropriate start timing of the Q-axis rotation by including the time in which the mounting nozzles 83 and 85 are carrying out the respective mounting work in the second required time T2 for the Q-axis rotation. In the example described above, description is given of the two mounting nozzles 83 and 85; however, even will three or more mounting nozzles, by performing control in the same manner, the control section 51 becomes capable of optimizing the start timing of the Q-axis rotation.

In the example described above, the control section 51 may carry out a control method (fly vision) of imaging the electronic component P while still moving the mounting head 33 without stopping above the camera device 19. For example, the example illustrated in FIG. 4 is a case in which the electronic component P is subjected to Q-axis rotation by 90 degrees counterclockwise from the angle at which the electronic component P is sucked at the supply position P1, the first required time T1 is 80 ms, and the rotation time T3 required for the mounting nozzle 73 to be subjected to the Q-axis rotation by 90° is 102 ms. Therefore, the difference between the first required time T1 and the rotation time T3 is 22 ms. When the mounting head 33 heads toward the imaging position P2 straight after sucking the electronic component P using the mounting nozzle 73, after reaching the imaging position P2, the mounting head 33 waits 22 ms for the Q-axis rotation to complete. In other words, the mounting head 33 stops once at the imaging position P2. Correspondingly, for example, the control section 51 performs control which causes the mounting head 33 to move to the imaging position P2 after 22 ms has elapsed from when the Q-axis rotation of the mounting nozzle 73 is started after acquiring the electronic component P at the supply position P1. Since the Q-axis rotation of the mounting nozzle 73 at the imaging position P2 is completed, the control section 51 causes the mounting nozzle 73 to pass the imaging position P2 without stopping once, and causes the moving electronic component P to be imaged by the camera device 1. Accordingly, the control section 51 is capable of achieving further shortening of the mounting time by causing the mounting nozzle 73 to pass the imaging position P2 without stopping once.

In the example described above, the optimization of the start timing of the Q-axis rotation is carried out before and after the imaging using the imaging process of the camera device 19 as a reference; however, the optimization may be carried out using another process as a reference. For example, in a case in which is necessary to perform processes using a unit other than the camera device 19 such as a dip unit which coats the terminals of the electronic component P with solder, or a coplanarity unit which inspects the planarity of the terminals of the electronic component P, the control section 51 may carry out the optimization of the start timing in the movement time before and after the processes using the work with these units as a reference. Alternatively, the control section 51 may optimize the start timing of the Q-axis rotation according to the movement time of each of the devices using the processes of the plurality of devices such as the camera device 19, the dip unit and the coplanarity unit as a reference.

In the example described above, in a case in which the first required time T1 is long in comparison to the rotation time T3, the control section 51 is set to prioritize carrying out the Q-axis rotation before the imaging; however, the configuration is not limited thereto. For example, the control section 51 may be set to prioritize the Q-axis rotation before the imaging by an operator operating the operation device 29. In this configuration, the operator determines the degree of mounting precision of the electronic component P onto the circuit board CB, and it becomes possible to prioritize the mounting precision over the mounting time depending on the board type to be produced. The camera device 19 may be configured to be movable without the arranged position being fixed. For example, the camera device 19 may be configured to be movable in the X-axis direction and the Y-axis direction based on the control from the control section 51. In this case, the control section 51 performs determination including the conditions under which to move the camera device 19 (the imaging position P2) in the determination of the start timing of the Q-axis rotation.

The mounting nozzle 73 is not limited to a configuration in which air pressure is used to suck the electronic component P, and may be configured to hold the electronic component P by electromagnetic force, pinching, or the like. As the component mounting device in the example described above, description is given of the component mounting machine 10 which mounts the electronic component P onto the circuit board CB; however, the component mounting device in the present application is not limited thereto, and, for example, may be applied to another component mounting device such as a work robot which carries out assembly work of secondary cells (solar cells, fuel cells, and the like) or the like. In this case, the arm of the work robot is an example of the movable section in the present application.

REFERENCE SIGNS LIST

10: component mounting machine, 15: component supply device, 19: camera device, 25: feeder, 33: mounting head, 41: X-axis driving mechanism, 43: Y-axis driving mechanism, 49: Q-axis rotation driving mechanism, 51: control section, 73: mounting nozzle, CB: circuit board, L1: Q-axis, P: electronic component, P1: supply position, P2: imaging position, P4 to P6: mounting position, T1: first required time, T2: second required time, T3: rotation time, T4: mounting time.

The invention claimed is:

1. A component mounting device comprising:
a component supply device which supplies a component to be mounted onto a target object to a supply position;
a movable section which includes a mounting nozzle which acquires and holds the component from the supply position, and which mounts the component which is held by the mounting nozzle onto a mounting position of the target object;
a driving mechanism which moves the movable section and causes the mounting nozzle to rotate around a Q-axis which is a rotating axis;
an imaging device which images the component which is held by the mounting nozzle at an imaging position; and
a control section configured to control the driving mechanism to move the movable section from the supply position to the mounting position via the imaging position,
wherein when the movable section moves from the supply position to the mounting position, the control section is further configured to
determine a first required time which is required for a first movement from the supply position to the imaging position,
determine a second required time which is required for a second movement from the imaging position to the mounting position,
compare the first required time to the second required time to determine which of the first required time and the second required time is longer, and
start rotation of the Q-axis of the mounting nozzle during a movement operation corresponding to the longer of the first required time or the second required time.

2. The component mounting device according to claim 1, wherein the control section is further configured to
determine a rotation time which is a time from start to completion of the rotation of the Q-axis by the mounting nozzle, and
start the rotation of the Q-axis of the mounting nozzle in the movement operation from the supply position to the imaging position when the rotation time is less than or equal to the first required time.

3. The component mounting device according to claim 1, wherein the imaging device is set to image the component in a state of being held at one imaging angle among a plurality of imaging angles which are set for every angle equally spaced in relation to a rotational angle around the Q-axis, and
wherein the control section is further configured to
determine a rotation time which is a time from start to completion of the rotation of the Q-axis by the mounting nozzle,
determine a first divided time which is a time from start to a predetermined imaging angle of the rotation of the Q-axis by the mounting nozzle during the first movement,
determine a second divided time which is a time from the predetermined imaging angle to completion of the rotation of the Q-axis by the mounting nozzle during the second movement, and
carry out the rotation of the Q-axis in conditions under which a required time is shortest among the following three required times (first divided time−first required time+second divided time−second required time), (rotation time−first required time), and (rotation time−second required time).

4. The component mounting device according to claim 1, wherein the movable section further comprises a plurality of mounting nozzles, and
wherein, after a first mounting nozzle of the plurality of mounting nozzles acquires the component in the first required time of the first mounting nozzle, the control section is further configured to determine an acquiring time which is required for other mounting nozzles of the plurality of mounting nozzles excluding the first mounting nozzle to acquire the components from the supply position.

5. The component mounting device according to claim 1,
wherein the movable section further comprises a plurality of mounting nozzles, and
wherein, before a first mounting nozzle of the plurality of mounting nozzles mounts the component onto the mounting position of the target object in the second required time of the first mounting nozzle, the control section is further configured to determine a mounting time which is required for other mounting nozzles of the plurality of mounting nozzles excluding the first mounting nozzle to mount the components onto the mounting positions.

* * * * *